(12) United States Patent
Jimenez Buendia

(10) Patent No.: US 9,128,133 B2
(45) Date of Patent: Sep. 8, 2015

(54) METHOD AND MODULE FOR MEASURING THE RATE OF CHANGE OF FREQUENCY OF WAVEFORMS RELATED TO CONVERTER UNITS IN WIND TURBINE GENERATORS

(71) Applicant: GAMESA INNOVATION & TECHNOLOGY, S.L., Sarriguren (Navarra) (ES)

(72) Inventor: Francisco Jimenez Buendia, Sarriguren (ES)

(73) Assignee: GAMESA INNOVATION & TECHNOLOGY, S. L., Sarriguren (Navarra) (ES)

( * ) Notice: Subject to any disclaimer, the term of this patent is extended or adjusted under 35 U.S.C. 154(b) by 365 days.

(21) Appl. No.: 13/873,468

(22) Filed: Apr. 30, 2013

(65) Prior Publication Data

US 2013/0341922 A1    Dec. 26, 2013

(30) Foreign Application Priority Data

May 3, 2012    (ES) .................................. 201200454

(51) Int. Cl.
*G01R 23/167*    (2006.01)
*F03D 9/00*    (2006.01)
*G01R 23/00*    (2006.01)

(52) U.S. Cl.
CPC .............. *G01R 23/167* (2013.01); *F03D 9/002* (2013.01); *F03D 9/003* (2013.01); *G01R 23/00* (2013.01); *Y02E 10/725* (2013.01)

(58) Field of Classification Search
CPC ...... G01R 23/167; G01R 23/00; F03D 9/003; F03D 9/002; Y02E 10/725
USPC ........... 700/286, 287; 290/44, 55; 702/70, 75; 416/1, 61
See application file for complete search history.

(56) References Cited

U.S. PATENT DOCUMENTS

| | | | |
|---|---|---|---|
| 3,032,715 A | 5/1962 | Frye | |
| 7,840,313 B2 * | 11/2010 | Horio et al. | 700/292 |
| 8,358,035 B2 * | 1/2013 | Bright | 307/84 |
| 2007/0136013 A1 | 6/2007 | Premerlani et al. | |
| 2008/0179966 A1 * | 7/2008 | Horio et al. | 307/126 |
| 2011/0031810 A1 * | 2/2011 | Bright | 307/51 |
| 2012/0035775 A1 * | 2/2012 | Garcia | 700/287 |

FOREIGN PATENT DOCUMENTS

GB    2 159 963 A    12/1985

* cited by examiner

*Primary Examiner* — Charles Kasenge
(74) *Attorney, Agent, or Firm* — Ladas & Parry LLP (57) ABSTRACT

Method and module for measuring the rate of change of frequency of a waveform related to a converter unit of a wind turbine generator, comprising: measuring an instantaneous value of said rate of change of frequency of the waveform, calculating a first filtered value of said rate of change of frequency, said first filtered value having good accuracy but low time response, and calculating a second filtered value of said rate of change of frequency said second filtered value having a good time response but low accuracy, comparing said first and second filtered values and selecting that an output value of said measured rate of change is based on said first or second filtered values depending on said comparison.

14 Claims, 6 Drawing Sheets

ND MODULE FOR MEASURING
METHOD AND MODULE FOR MEASURING THE RATE OF CHANGE OF FREQUENCY OF WAVEFORMS RELATED TO CONVERTER UNITS IN WIND TURBINE GENERATORS

FIELD OF THE INVENTION

The present invention refers to a method and a module of measuring the rate of change of frequency for waveforms related to converter units, preferably in wind turbines.

BACKGROUND OF THE INVENTION

Controller modules and systems for converter units in wind turbines require accurate operation while keeping a good time response.

For measuring the rate of change of frequency prior art documents disclose analog and digital measurement alike. US003032715 describes an analog frequency measurement by CCU with structural code. GB2159963 describe a measurement system based on counting the period of the voltage waveform as used in state of the art relays for measuring the rate of change of frequency.

The use of relays for measuring parameters relating to frequencies are well known. In electrical systems, a rate of change relay detects the zero crossings of a generator voltage. The relay then measures the time between the zero crossing and calculates a new frequency after each zero crossing. In case that the frequency changes too much the relay will trip. This method is, however, very sensitive to noise in the voltage waveform and typically requires several voltage waveforms before a measured can be determined. Moreover, relays are conceptually designed to detect vector shift rather than the rate of change of waveforms.

Other known methods are based on frequency measurements. For instance, US2007136013 describes several frequency measurements that allow the calculation of the finite derivative of said frequencies. This document describes a finite method with measuring points spaced in half cycle periods. With said measurements as inputs, the method subsequently determines the time derivative by subtracting two consecutive measurements and dividing the result by the half period, or eventually the inverse of the frequency value as measured.

Another method known to the art is to employ the frequency which is measured by the converter unit using state of the art phase-locked loops (PLLs). Those phase-locked loops calculate angle and frequency of the voltage waveform with a good accuracy. Subsequently, the method for calculation of the rate of change of frequency (ROCOF) will be based on the derivative of the frequency measurement from the control converter unit PLL. Mathematical considerations for extracting said outputs are mainly based on two methods, either calculating the derivative of the grid voltage frequency values using finite differences, or by calculating the second derivate of the grid voltage angle values using derivate functions.

When measuring the rate of change (ROCOF) noise a critical issue. This noise comes from the grid voltage and also from harmonics of the grid voltage. Furthermore, the derivative nature of ROCOF causes noise to be amplified and even worsens said critical issue.

Hence, an object of the present invention is to provide a measuring method and system that is robust and not affected by noise. Encompassed within the framework of noise elimination strategies, several other problems may arise, for example the discontinuity of measured output waveforms.

Controller units of wind turbines need to measure frequency and rate of frequency of variables, preferably voltage waveforms in converter units of wind turbines. The operation of said controllers requires a quick time response, typically a range between 400 to 200 ms or even less. This is difficult to attain while keeping a good accuracy at the same time.

In wind turbine systems, there is a trade-off between the accuracy and time response of ROCOF. Those two requirements are generally contradictory because increasing accuracy requires filtering which also increases time response.

Hence, it is yet another object of the present invention to provide a measuring method and module that can be accurate and yet have a quick time response for controlling the converter unit of a wind turbine.

SUMMARY OF THE INVENTION

Some of the objects and problems mentioned above are solved by a method and module according to the present invention. Namely, the present invention describes a method for measuring the rate of change of frequency of waveform related to a converter unit of a wind turbine generator, said method comprising the steps of measuring an instantaneous value of a frequency value of said waveform related to said converter unit, calculating a first filtered value (ROCOF-F1) of said rate of change of frequency (ROCOF) based on said instantaneous frequency value, said first filtered value (ROCOF-F1) having a measurement error lower than a first predetermined measurement error (DB-ROCOF-F1), said first filtered value (ROCOF-F1) having a time response slower than a predetermined time response requirement (t1), and, calculating a second filtered value (ROCOF-F2) of said rate of change of frequency (ROCOF) based on said instantaneous frequency value, said second filtered value (ROCOF-F1) having a second measurement error (DB-ROCOF-F2) higher than said first predetermined measurement error (DB-ROCOF-F1), said second filtered value (ROCOF-F2) having a time response faster than said predetermined time response requirement (t1), and calculating a comparison value (Comp) between said first filtered value (ROCOF-F1) and said second filtered value (ROCOF-F2), and determining that an output (ROCOF-CNT) value of said measured rate of change is based on said first filtered value (ROCOF-F1) when said comparison value (Comp) stays lower or becomes lower than a predetermined threshold level, and determining that said output (ROCOF-CNT) value of said measured rate of change is based on said second filtered value (ROCOF-F2) when said comparison value (Comp) becomes higher than said predetermined threshold level, wherein said predetermined threshold is determined based on said second predetermined measurement error (DB-ROCOF-F2).

Preferably the step of calculating a comparison value (Comp) includes calculating the absolute value (Abs–Comp) of the difference between the first (ROCOF-F1) and second (ROCOF-F2) filtered values.

Advantageously, the method determines that said output value (ROCOF-CNT) is zero when an absolute value of said first filtered value (ROCOF-F1) is lower than said first predetermined measurement error (DB-ROCOF-F1), and it determines that said output value (ROCOF-CNT) becomes the first filtered value (ROCOF-F1) when the absolute value of said first filtered value (RECOF-F1) becomes higher than said first predetermined measurement error (DB-ROCOF-F1) while the absolute value (Abs–Comp) of said comparison is below said predetermined threshold, and the method further determines that said output value (ROCOF-CNT) becomes the second filtered value (ROCOF-F2) when said absolute value (Abs–Comp) of said difference is above said predetermined threshold, and after the output value (ROCOF-CNT) has become the second filtered value (ROCOF_F2), it is determined that said output value (ROCOF-CNT) is the first filtered value (ROCOF-F1) when said absolute value (Abs-Com) of said difference becomes lower than said predetermined second threshold.

Preferred values for the predetermined threshold are the second predetermined measurement error (DB-ROCOF-F2) of the second filter (F2), and it may specifically be between 0.125 and 0.5 millihertz per second.

Moreover, said predetermined threshold may correspond to a hysteresis value (DB-ROCOF-D2-HYS) preferably being twice the second predetermined measurement error (DB-ROCOF-D2).

Furthermore, other desirable steps may include smoothing measured output values (ROCOF-CNT) with a filtering function, preferably the filtering function being a first order filter function. Other measures include limiting measured output values (ROCOF-CNT) with a rate limiter block.

Additionally, the calculation of first (ROCOF-F1) and second (ROCOF-F2) filtered values is preferably carried out using an averaging method or a transfer function. In particular, the averaging method is preferred for calculating the first (ROCOF-F1) filtered value.

This method is preferably embedded in a controller unit of a wind turbine generator. Thus, the method furthermore includes sending said output value (ROCOF CNT) of said rate of change of frequency to a controller (CNT) of a wind turbine, and controlling a converter unit (Converter) of a wind turbine generator.

The present invention also describes a module for carrying out the measuring method. In general terms, said module comprises a circuit for measuring an instantaneous value of the frequency of at least a waveform related to said converter unit, a first filter (F1) for calculating a first filtered value (ROCOF-F1) of said rate of change of frequency (ROCOF) based on said measured instantaneous frequency value, said first filtered value (ROCOF-F1) having a measurement error lower than a first predetermined measurement error (DB-ROCOF-F1), said first filtered value (ROCOF-F1) having a time response slower than a predetermined time response requirement (t1), and a second filter (F2) for calculating a second filtered value (ROCOF-F2) of said rate of change of frequency (ROCOF) based on said instantaneous frequency value, said second filtered value (ROCOF-F1) having a second measurement error (DB-ROCOF-F2) higher than said first predetermined measurement error (DB-ROCOF-F1), said second filtered value (ROCOF-F2) having a time response faster than said predetermined time response requirement (t1), and a comparator for calculating a comparison value (Comp) between said first filtered value (ROCOF-F1) and said second filtered value (ROCOF-F2), and an output value of said rate of change (ROCOF-CNT) based on said first filtered value (ROCOF-F1) when said comparison value (Comp) stays lower or becomes lower than a predetermined threshold level, and said output value of said rate of change (ROCOF-CNT) is based on said second filtered value (ROCOF-F2) when said comparison value (Comp) becomes higher than said predetermined threshold level, said predetermined threshold is based on said second predetermined measurement error (DB-ROCOF-F2).

Preferably said module includes calculating means for determining the absolute value (Abs–Comp) of the difference between the first (ROCOF-F1) and second (ROCOF-F2) filtered values. Additionally, said module may comprise means for limiting or smoothing said output value (ROCOF-CNT), preferably a hard limiter, a rate limiter and/or a first order filter.

FIGURES

FIG. 3, which includes FIGS. 3A-3D depicts an embodiment of the present invention with a preferred electronic circuit for measuring the rate of change of frequency (ROCOF) of waveforms.

DESCRIPTION OF THE PREFERRED EMBODIMENTS

Figure 1:
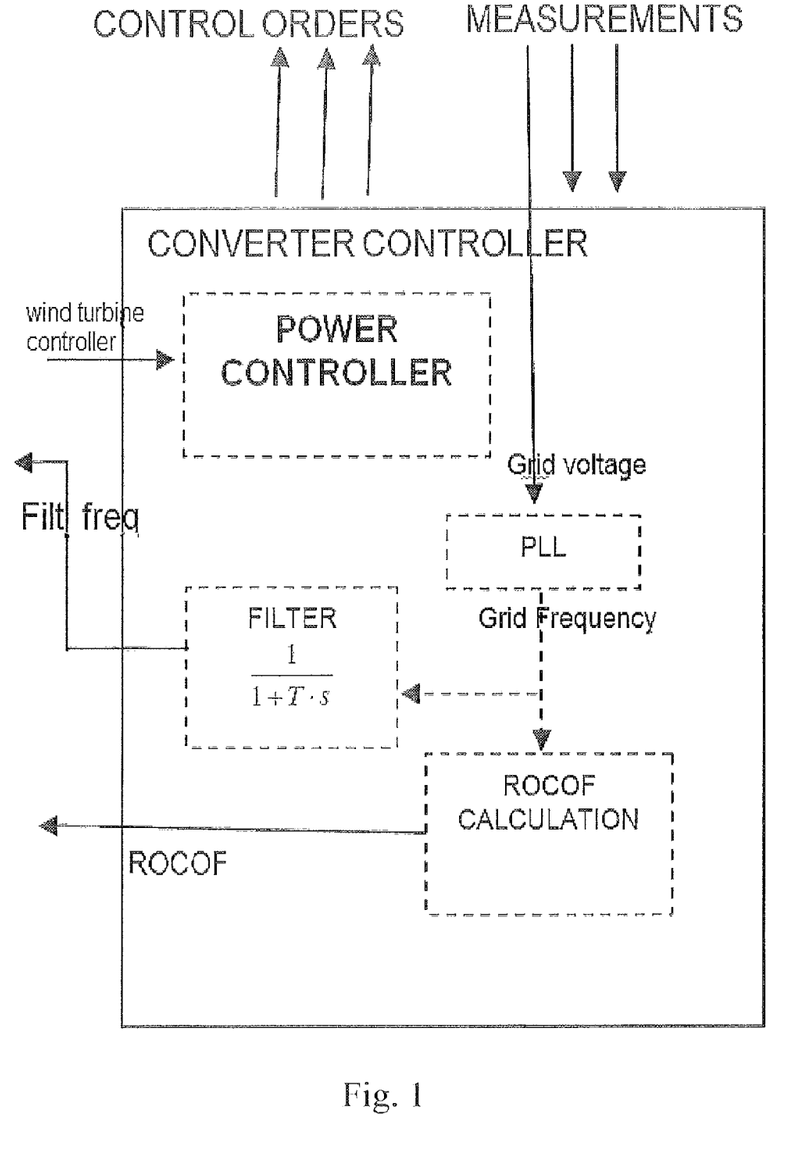
FIG. 1 shows an embodiment of a system where the rate of change of frequency is integrated in a converter controller inside a wind turbine generator.

FIG. 1 shows a converter controller of a converter unit for a wind turbine generator. The present invention relates to variable speed wind turbines that are connected to the grid and the effects of a change of grid frequency. It is important to have an accurate and quick measurement of the frequency and the rate of change of frequency of the grid voltage so as to adapt the operation of the wind turbine generator to the new grid condition.

Typically wind turbine controllers need the frequency and rate of frequency measurements that show a quick time response, typically being 200 ms or less. This quick time requirement is a tight requirement for the measurement unit within the converter controller.

A Voltage waveform in the converter unit is the preferred variable to be measured. However, other variables based on current and/or other voltage and power parameters may be used.

A preferred method for measuring the frequency of the grid voltage waveform is to use state-of-the-art phase locked loops, PLLs, at the converter unit. Said PLLs are used to calculate angle and frequency of the voltage wave. A wind turbine controller will need a frequency measurement as provided by the PLL. Before sending it a first order filter is applied so as to minimize glitches and other noise present in the grid and/or the measurement equipment.

Subsequently an instantaneous rate of change of frequency (ROCOF) may be measured based on the derivative of the frequency measurement or any other suitable method. Said derivative can preferably be calculated by using finite differences of the grid voltage frequency or by calculating second derivatives. However, as already explained before, said instantaneous measurement will not comply with the time response required by the controller.

The present invention proposes calculating two filtered values of the needed rate of change of frequency (ROCOF). A first filtered value (ROCOF-F1) uses a filtering function that has a measurement error lower than a first predetermined measurement error (DB-ROCOF-F1), but at the same time has a time response slower than a predetermined time response requirement (t1), typically being in the range between 200 milliseconds to 400 milliseconds. Thus, this first filtered value has an improved accuracy but cannot be used if variations of the grid voltage frequency appear suddenly.

To help with that limitation a second filtered value (ROCOF-F2) is used. Namely, the second value shows less accuracy but it can comply with the time constraint requirement. The output variable of the ROCOF measurement is thus selected between the first and second filtered values normally according to accuracy requirements when grid voltage variations are minor. However, for larger variations the output value will swap to the second filtered value (ROCOF-F1). In this manner, continuous operation of the wind turbine controller is guaranteed at all times.

Both the first filtered value (ROCOF-F1) and the second filtered value (ROCOF-F2) may be calculated using averaging methods or transfer functions. The averaging method is preferred for the first filtered value due to its inherent high accuracy and low time response. This method is based on averaging frequency over a period of time and calculating a rate of change (ROCOF) value as finite differences of two values of averaged frequency.

As way of example, the method preferably calculates averages of frequency of the last ΔT1 milliseconds (for example last 200 ms) and stores those averages. Then, after ΔT2 (for example 1000 ms) the 200 ms average made between t-ΔT2 and t-ΔT2-ΔT1 T and the average done between t and t-ΔT1 are used in the finite difference formula:

$$\frac{df}{dt} = \frac{\sum_{t}^{t-\Delta t1} f(t) - \sum_{t-\Delta t2}^{t-\Delta t2 - \Delta t1} f(t)}{\Delta t_2}$$

where $\Delta t_2$ must be $\Delta t_2 \geq \Delta t_1$ because the period of derivate should be always bigger than the averaging to avoid bad calculations.

This formula can be simplified and better understood when $\Delta t_2 = \Delta t_1$. The formula takes the following form:

$$\frac{df}{dt} = \frac{\sum_{t}^{t-\Delta t1} f(t) - \sum_{t-\Delta t1}^{t-2\cdot \Delta t2} f(t)}{\Delta t_1}$$

As already mentioned, a transfer function may be used to model any of the two filters as tuning of parameters can achieve a good accuracy and low rise time or, vice versa, a low rise time or bad accuracy and lower rise time.

A preferred derivative transfer function has a second order denominator so that its gain for frequency components of signal at infinity is zero. This means that it inherently works as low pass filter or attenuator, and therefore noise is not amplified. Also, the system is stable. The transfer function may be expressed with the following equations:

$$\frac{k_1 \cdot S}{S^2 + k_2 \cdot S + k_3} \text{ or } \frac{GS}{S^2 + 2\xi\omega_n S + \omega_n^2}$$

Said forms are used as derivative low pass filters, where G is gain, ξ (geta) is a damping factor and $\omega_n$ the natural frequency of oscillation.

By tuning k values (or ξ and $\omega_n$ for the corresponding equation) different time response and noise errors can be achieved. The lower the time response is the higher the noise cancellation. It is preferably to tune the k values to avoid instability of the system: extra power is calculated according to ROCOF measurements and this extra power also changes frequency and ROCOF. This coupling can lead the frequency to instability if the k factors are not tuned adequately.

Thus, transfer functions when compared to using averaging methods are seen to be more stable per nature due to their low pass filtering of noise. Furthermore, this method is computationally efficient because it has to store a lower number of variables in memory.

To achieve a first filter (F1) transfer function for said first filtered value (ROCOF-F1), preferred parameters include a low value of $\omega_n$ and high value of ξ.

Contrary to that, a second filtered value (ROCOF-F2) is with a high value of $\omega_n$ and low value of ξ.

Figure 2:
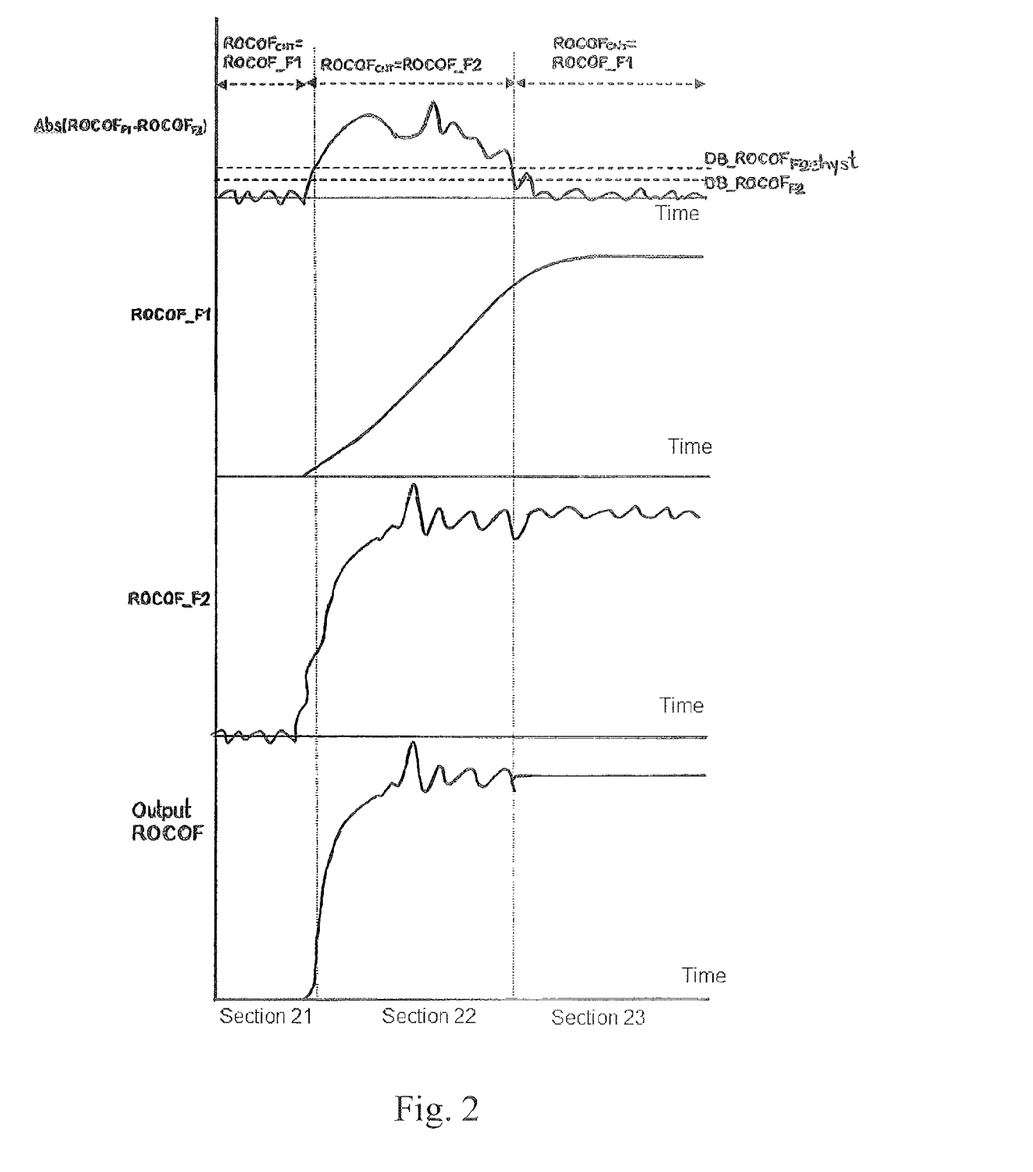
FIG. 2 shows an embodiment with time diagram of waveforms corresponding to the first, second filtered values, output values of the rate of change measurements as well the absolute value of their difference.

FIG. 2 shows the time evolution of several variables important for understanding the invention. It can be seen that the first filtered value (ROCOF-F1) does not show rippling and has a general smooth shape. Sudden changes in grid voltage are not going to be followed by the current, no matter how accurate its final state may be.

Quick variations of said grid voltage may be followed by the second filter (ROCOf_F2). The general shape of this curve shows the rippling of sudden variations. Its main drawback is its limited measurement accuracy.

The top curve of FIG. 2, marked as Abs (ROCOF-F1 minus ROCOF-F2) shows the absolute value of said differences. The curve shows three regions. A first section (21) of this curve occurs when the absolute value of the first filtered value is lower than a measurement error (DB) of said first filter. DB is also called the measurement dead band and it should be bigger than the accuracy (noise) of the first filter (F1). The output value of the rate of change of frequency (ROCOF) is then identified as zero.

If $|ROCOF_{F1}| \leq DB_{ROCOF\_F1}$, then $ROCOF_{CNT} = 0$

A second section (22) is reached when a comparison value between the first and second filtered values, preferably the absolute value of their difference, attains a predetermined threshold value or level. Said threshold is defined by the accuracy of the second filter (DB-ROCOF-F2) or a hysteresis value thereof. The hysteresis value generally amounts twice the value of the second filter measurement error.

Once the threshold is achieved, the second filtered value (ROCOF-F2) is selected as the output value (ROCOF-CNT).

If $|ROCOF_{F1} - ROCOF_{F2}| > DB_{ROCOF\_F2\_hys}$ then $ROCOF_{CNT} = ROCOF_{F2}$ This allows a time response (t1) in accordance with the wind turbine generator controller requirements, albeit renouncing to accuracy to some extent.

The second section comes to an end once the calculated comparison value, namely the preferred absolute value of the difference comes to be less than the second filter dead band including hysteresis.

If $ROCOF_{CNT} = ROCOF_{F2}$ and $|ROCOF_{F1} - ROCOF_{F2}| < DB_{ROCOF\_F2}$ then $ROCOF_{CNT} = ROCOF_{F1}$ Finally, the third section (23) of the curve outputs the first filtered value (ROCOF-F1) again.

FIG. 3 shows a preferred electronic circuit for carrying out the method according to the present invention. FIG. 3A shows an overall view of the circuit, and FIGS. 3B-3D show details of a first stage unit (31), second stage unit (32), and third stage unit (33), respectively.

Figure 3A:
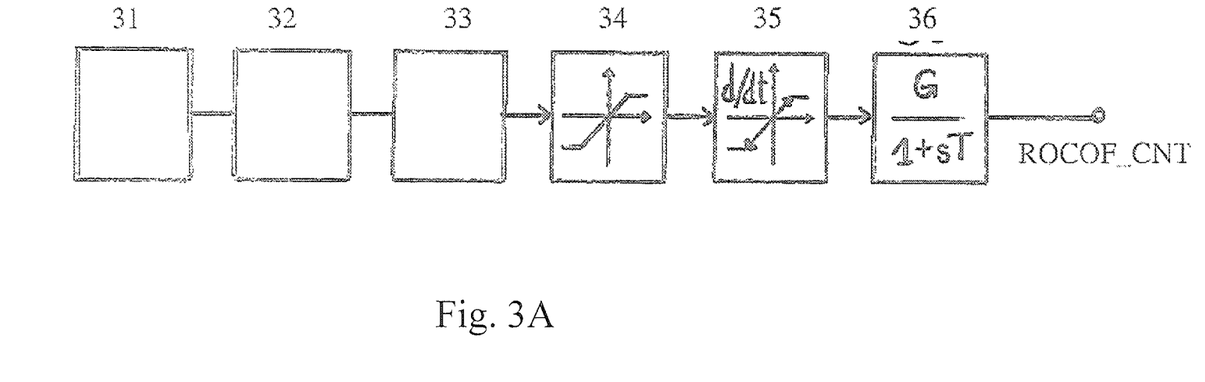
FIG. 3A shows an overall view of the circuit.
Figure 3B:
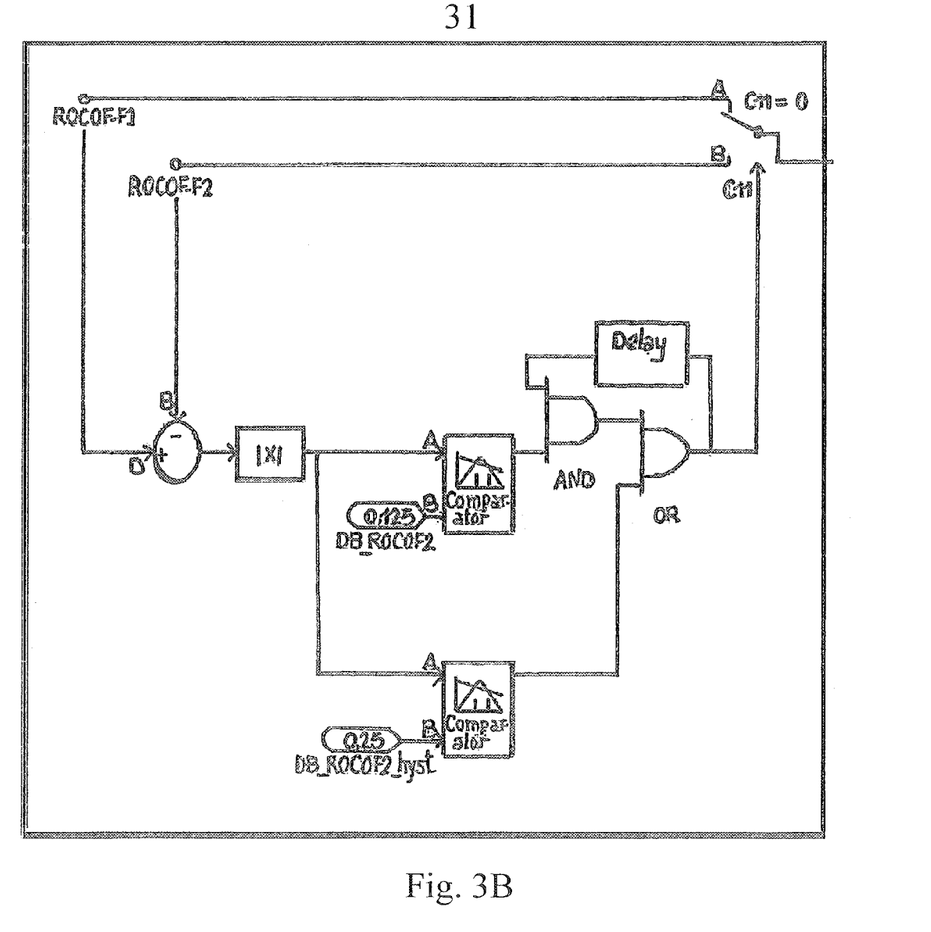
FIGS. 3B-3D show details of a first stage unit, second stage unit, and third stage unit, respectively.

A first stage unit (31) carries out the two step rate of change of frequency (ROCOF) measurement, preferably using hysteresis. Inputs to said first unit (31) are values of said first and second filtered values. Their difference is calculated, either by analog or digital means, the output being an absolute value (Abs–Comp) of said comparison. This signal subsequently constitutes an input to a following stage of comparators. Said comparators have predetermined threshold values, these being the predetermined measurement error of the second filter (ROCOF-F2-DB), typically 0.125 mHz, and a hysteresis value related thereof, typically 0.25 mHz. Said hysteresis value is preferably set at twice the second filter measurement error. The output of the said two comparators is logically processed, preferably by AND and/or OR logical operators. Said operators may, in its turn, be implemented with sequential and/or feedback electrical or electronic arquitectures. In this manner a conditional switch is controlled. Said switch preferably selects either the first or the second filtered values. This selection is mostly the direct values of the selected filter, but it may also have a multiplying factor, e.g. a constant, or any other suitable manipulation. This output may be the overall output value, namely the output value (ROCOF-CNT) that is sent to the controller of the wind turbine generator. However, other stages may be added to obtain a signal of lower noise.

Figure 3C:
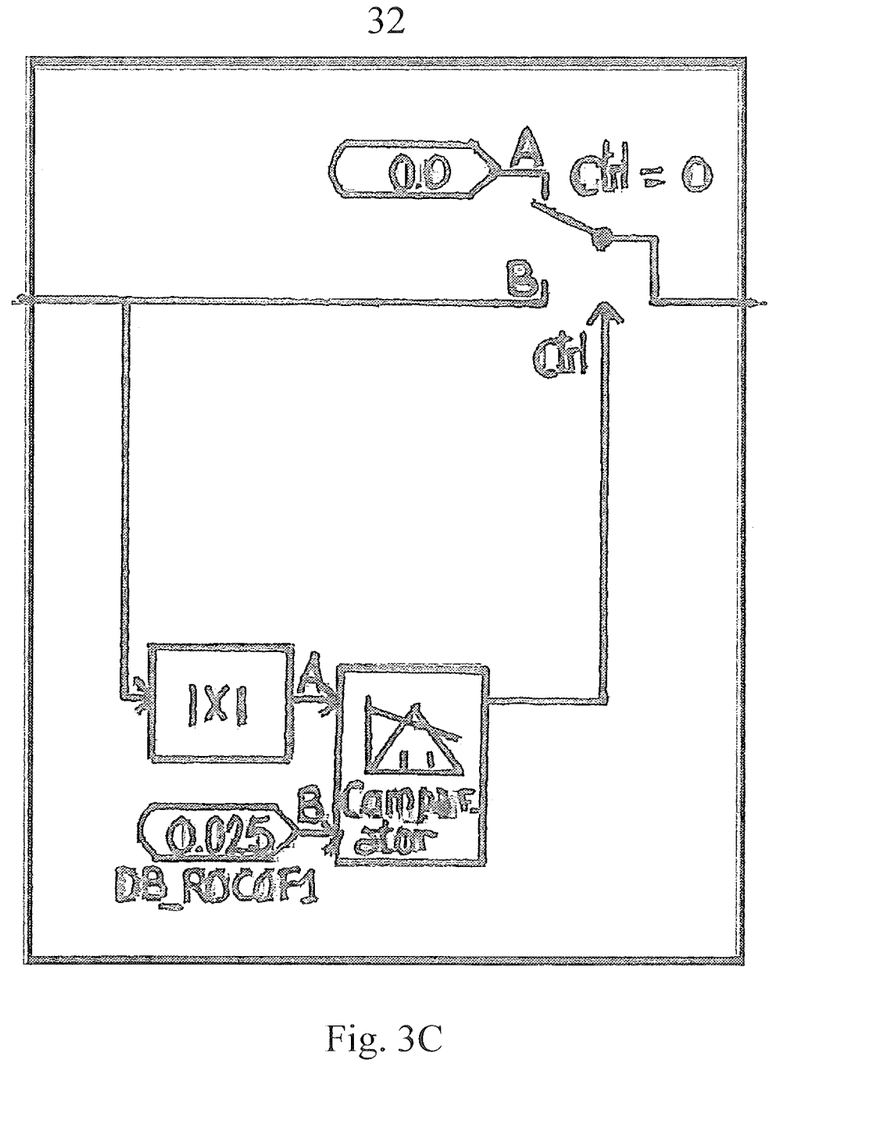

Thus, the output signal corresponding to the first stage unit (31) may be the input of an optional second stage unit (32). Said unit (32) will consider the application of the first dead band (DB) from the first filter (F1). Again, its preferred implementation takes the form of an absolute value operator in combination with a comparator. The reference value of said comparator is the predetermined measurement error of said first filter. Its value is preferably 0.125 mHz or lower. The output signal for values below that measurement error will all be considered as zero.

Figure 3D:
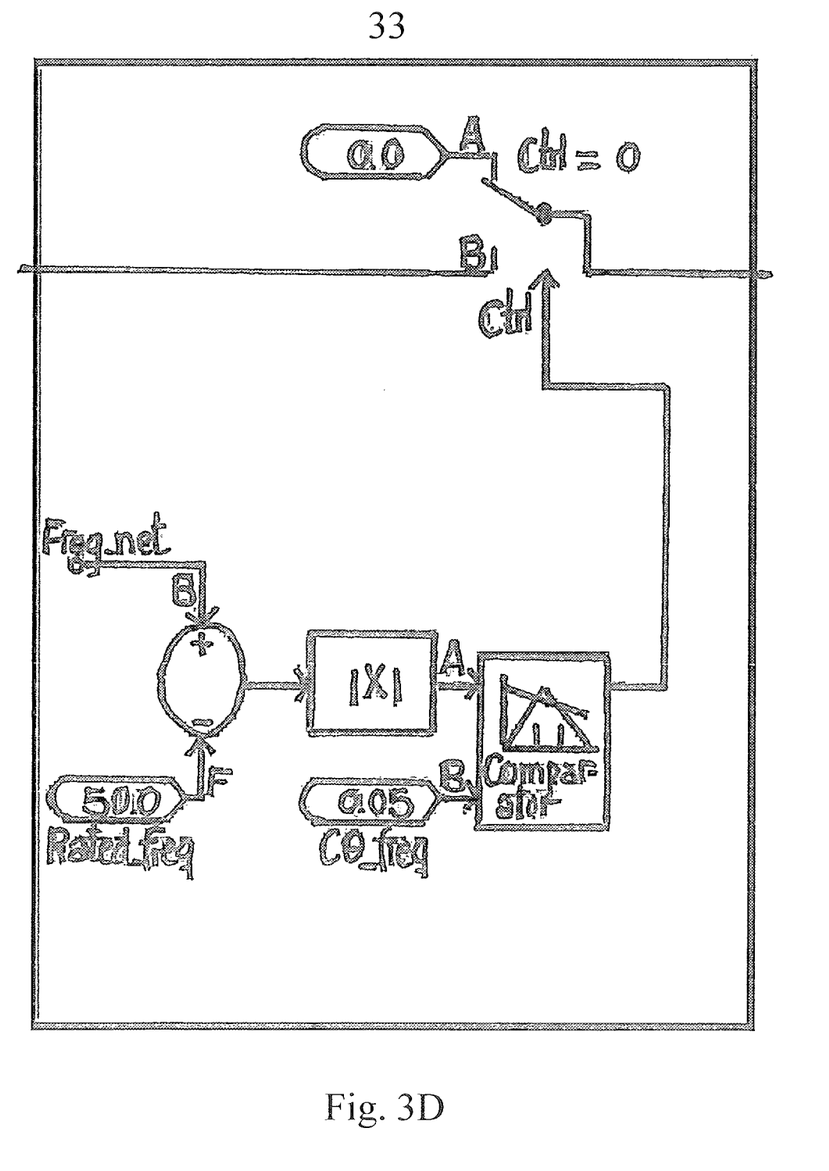

A third stage (33) may optionally be added for considering the dead band of the rate of change of frequency according to the frequency value. In Europe a rated frequency of 50 Hz is taken, while values in the US and other countries will amount 60 Hz. Other values are possible depending on the rated frequency of the system.

A fourth optional stage unit (34) is added as a hard limiter and be advantageously be implemented as a saturation filter. Additionally a fifth optional stage (35) as a rate limiter may also be added for limiting the rate of change of measurements in case of a sharp change between the first and second filtered values. Sudden changes to zero due to frequency and ROCOF dead bands will also be minimized.

Finally, a sixth optional stage (36) may be added to smooth any transition as with the rate limiter. This stage may be implemented as a first order transfer function.

Figures and embodiments are regarded as preferred examples for illustration purposes. The invention is defined by the scope of the claims.

The invention claimed is:

1. Method for measuring the rate of change of frequency (ROCOF-CNT) of a waveform related to a converter unit of a wind turbine generator, said method comprising the steps of:
    measuring an instantaneous frequency value of said waveform related to said converter unit,
    calculating a first filtered value (ROCOF-F1) of said rate of change of frequency (ROCOF) based on said instantaneous frequency value, said first filtered value (ROCOF-F1) having a measurement error lower than a first predetermined measurement error (DB-ROCOF-F1), said first filtered value (ROCOF-F1) having a time response slower than a predetermined time response requirement (t1), characterized by
    calculating a second filtered value (ROCOF-F2) of said rate of change of frequency (ROCOF) based on said instantaneous frequency value, said second filtered value (ROCOF-F1) having a second measurement error (DB-ROCOF-F2) higher than said first predetermined measurement error (DB-ROCOF-F1), said second filtered value (ROCOF-F2) having a time response faster than said predetermined time response requirement (t1), and
    calculating a comparison value (Comp) between said first filtered value (ROCOF-F1) and said second filtered value (ROCOF-F2), and
    determining that an output (ROCOF-CNT) value of said measured rate of change is based on said first filtered value (ROCOF-F1) when said comparison value (Comp) stays lower or becomes lower than a predetermined threshold level, and
    determining that said output (ROCOF-CNT) value of said measured rate of change is based on said second filtered value (ROCOF-F2) when said comparison value (Comp) becomes higher than said predetermined threshold level, wherein
    said predetermined threshold is determined based on said second predetermined measurement error (DB-ROCOF-F2).

2. Method for measuring the rate of change of frequency (ROCOF-CNT) according to claim 1, wherein the step of calculating a comparison value (Comp) includes:
    calculating the absolute value (Abs–Comp) of the difference between the first (ROCOF-F1) and second (ROCOF-F2) filtered values.

3. Method for measuring the rate of change of frequency (ROCOF-CNT) according to claim 2, comprising:
    determining that said output value (ROCOF-CNT) is zero when an absolute value of said first filtered value (ROCOF-F1) is lower than said first predetermined measurement error (DB-ROCOF-F1),
    determining that said output value (ROCOF-CNT) becomes the first filtered value (ROCOF-F1) when the absolute value of said first filtered value (RECOF-F1) becomes higher than said first predetermined measurement error (DB-ROCOF-F1) while the absolute value (Abs–Comp) of said comparison is below said predetermined threshold, and
    determining that said output value (ROCOF-CNT) becomes the second filtered value (ROCOF-F2) when said absolute value (Abs–Comp) of said difference is above said predetermined threshold,
and
    after the output value (ROCOF-CNT) has become the second filtered value (ROCOF_F2), determining that said output value (ROCOF-CNT) is the first filtered value (ROCOF-F1) when said absolute value (Abs-Com) of said difference becomes lower than said predetermined second threshold.

4. Method for measuring the rate of change of frequency (ROCOF-CNT) according to claim 1, wherein
    said predetermined threshold is the second predetermined measurement error (DB-ROCOF-F2) of the second filter (F2), preferably being between 0.125 and 0.5 millihertz/s.

5. Method for measuring the rate of change of frequency (ROCOF-CNT) according to claim 1,
    said predetermined threshold corresponds to a hysteresis value (DB-ROCOF-D2-HYS), preferably being twice the second predetermined measurement error (DB-ROCOF-D2).

6. Method for measuring the rate of change of frequency (ROCOF-CNT) according to claim 2, comprising smoothing measured output values (ROCOF-CNT) with a filtering function, preferably said filtering function being a first order filter function.

7. Method for measuring the rate of change of frequency (ROCOF-CNT) according to claim 2, comprising
limiting measured output values (ROCOF-CNT) with a rate limiter block.

8. Method of measuring the rate of change of frequency (ROCOF-CNT) according to claim 2, comprising
calculating said first (ROCOF-F1) and second (ROCOF-F2) filtered values using at least an averaging method or a transfer function.

9. Method of measuring the rate of change of frequency (ROCOF-CNT) according to claim 8, comprising
calculating said first (ROCOF-F1) filtered value using an averaging method.

10. Method of controlling a converter unit of a wind turbine generator, comprising the steps of
measuring the rate of change of frequency (ROCOF-CNT) according to claim 1, and
sending said output value (ROCOF CNT) of said rate of change of frequency to a controller (CNT) of a wind turbine, and
controlling a converter unit (Converter) of a wind turbine generator.

11. Module for measuring the rate of change of frequency (ROCOF-CNT) of a waveform related to a converter unit of a wind turbine generator, said module comprising:
a circuit for measuring an instantaneous value of a frequency value of said waveform related to said converter unit,
a first filter (F1) for calculating a first filtered value (ROCOF-F1) of said rate of change of frequency based on said measured frequency value, said first filtered value (ROCOF-F1) having a measurement error lower than a first predetermined measurement error (DB-ROCOF-F1), said first filtered value (ROCOF-F1) having a time response slower than a predetermined time response requirement (t1), characterized by a second filter (F2) for calculating a second filtered value (ROCOF-F2) of said rate of change of frequency (ROCOF) based on said measured instantaneous frequency value, said second filtered value (ROCOF-F1) having a second measurement error (DB-ROCOF-F2) higher than said first predetermined measurement error (DB-ROCOF-F1), said second filtered value (ROCOF-F2) having a time response faster than said predetermined time response requirement (t1), and
a comparator for calculating a comparison value (Comp) between said first filtered value (ROCOF-F1) and said second filtered value (ROCOF-F2), and
an output value of said rate of change (ROCOF-CNT) is based on said first filtered value (ROCOF F1) when said comparison value (Comp) stays lower or becomes lower than a predetermined threshold level, and
said output value of said rate of change (ROCOF-CNT) is based on said second filtered value (ROCOF-F2) when said comparison value (Comp) becomes higher than said predetermined threshold level, said predetermined threshold is based on said second predetermined measurement error (DB-ROCOF-F2).

12. Module for measuring the rate of change of frequency (ROCOF-CNT) according to claim 11, wherein said comparator includes:
calculating means for determining the absolute value (Abs–Comp) of the difference between the first (ROCOF-F1) and second (ROCOF-F2) filtered values.

13. Module for measuring the rate of change of frequency (ROCOF-CNT) according to claim 11, wherein said module includes means for limiting or smoothing said output value (ROCOF-CNT).

14. Module for measuring the rate of change of frequency (ROCOF-CNT) according to claim 13, wherein said limiting or smoothing means are a hard limiter, a rate limiter and/or a first order filter.

* * * * *